United States Patent [19]

Eyuboglu

[11] Patent Number: 5,455,839
[45] Date of Patent: Oct. 3, 1995

[54] DEVICE AND METHOD FOR PRECODING

[75] Inventor: M. Vedat Eyuboglu, Boston, Mass.

[73] Assignee: Motorola, Inc., Schaumburg, Ill.

[21] Appl. No.: 813,725

[22] Filed: Dec. 27, 1991

[51] Int. Cl.$^6$ .............................. H04L 5/12; H04L 23/02; H04B 15/00
[52] U.S. Cl. ........................ 375/265; 371/43; 375/285; 375/296; 375/340; 375/346
[58] Field of Search ................................. 375/39, 58, 60, 375/99, 101, 59, 94, 18; 371/37.1, 43

[56] References Cited

U.S. PATENT DOCUMENTS

| 5,040,191 | 8/1991 | Forney, Jr. et al. | 375/39 |
| 5,150,381 | 9/1992 | Forney et al. | 375/39 |

OTHER PUBLICATIONS

"New Automatic Equaliser Employing Modulo Arithmetic", by M. Tomlinson, Electronics Letters, vol. 7, pp. 138–139, Mar. 1971.

"Matched–Transmission Technique for Channels With Intersymbol Interference", by Hiroshi Harashima and Hiroshi Miyakawa, IEEE Transactions on Communications vol. Com–20, pp. 774–780, Aug. 1972.

"Generalized Partial Response for Equalized Channels with Rational Spectra," D. G. Messerschmitt, IEEE Transactions on Communications, vol. COM–23, pp. 1251–1258, Nov. 1975.

"On the Transmitted Power in Generalized Partial Response," J. E. Mazo and J. Salz, IEEE Transactions on Communications, vol. COM–24, pp. 348–351, Mar. 1976.

"Coset Codes for Partial Response Channels; or, Coset Codes with Spectral Nulls", by G. David Forney, Jr., and A. R. Calderbank, IEEE Transactions on Information Theory, vol. IT–35, pp. 925–943, Sep. 1989.

"Baseband Line Codes Via Spectral Factorization," A. R. Calderbank and J. E. Mazo, IEEE Journal on Selected Areas in Communications, vol. SAC–7, pp. 914–928, Aug. 1989.

"Trellis Precoding: Combined Coding, Precoding and Shaping for Intersymbol Interference," by M. Vedat Eyuboglu and G. David Forney, Jr., IEEE Transactions on Information Theory, vol. 38, pp. 301–314, Mar. 1992.

"Trellis Shaping", by G. David Forney, Jr., IEEE Transactions on Information Theory, vol. 38, pp. 281–300, Mar. 1992.

"Coset Codes–Part I: Introduction and Geometrical Classification", by G. David Forney, Jr., IEEE Transaction on Information Theory, vol. IT–34, pp. 1123–1151, Sep. 1988.

"Channel Coding with Multilevel/Phase Signals", by Gottfried Underboeck, IEEE Transactions on Information Theory, vol. IT–28, pp. 55–67, Jan. 1982.

"MMSE Decision–Feedback Equalization and Coding–Part I: General Results," J. M. Cioffi, G. P. Dudevoir, M. V. Eyuboglu and G. D. Forney, Jr., IEEE Transaction on Communications, to appear.

"Generalized Square Constellations and Tomlinson Filters for Intersymbol–Interference Channels," L.-F. Wei, IEEE Transaction on Communications, May 1991.

Nonlinearly Feedback–Equalized Pam Vs. Capacity For Noisy Filter Channels, R. Price, Proc. ICC '72, Jun. 1972.

Primary Examiner—Stephen Chin
Assistant Examiner—Tesfaldet Bocure
Attorney, Agent, or Firm—Darleen J. Stockley

[57] ABSTRACT

A novel precoding technique (900) and device (100) allows transmission of a stream of signal points over a channel h(D) to provide efficient data transfer in the presence of intersymbol interference and noise at data rates approaching channel capacity. This new technique may be combined with trellis-coded modulation and works with any signal constellation. In addition, the present invention allows decoupling signal constellation shaping, a significant improvement over prior precoding techniques. Thus, the present invention simplifies shaping and allows signaling at fractional rates without constellation switching.

44 Claims, 3 Drawing Sheets

DEVICE AND METHOD FOR PRECODING

FIELD OF THE INVENTION

This invention relates generally to digital communication systems, and more particularly to precoding a digital data sequence for transmission in a digital communication system.

BACKGROUND OF THE INVENTION

It has been shown that on strictly band-limited high-signal-to-noise ratio (SNR) channels with Gaussian noise, digital data can be reliably transmitted at rates approaching channel capacity by using a combination of ideal zero-forcing decision-feedback equalization (DFE) and known coded modulation and constellation shaping techniques designed for ideal channels free of intersymbol interference (ISI). However, ideal DFE is not realizable. Trellis precoding is a realizable combined coding, shaping and equalization technique that achieves the same performance as an ideal DFE along with coding and shaping.

One potential drawback of trellis precoding is that it is effective only for signal constellations whose signal points are uniformly distributed within a space-filling boundary region. Space-filling substantially means that a union of proper non-overlapping translations of the boundary region can cover (tile) the entire space. Stated in another way, the boundary region must be representable as a fundamental region of a lattice, typically referred to as a precoding lattice. To be compatible with known coded modulation techniques, a precoding lattice is typically chosen as a scaled version $MZ^2$ of a two-dimensional integer lattice $Z^2$ (where M is a scaling factor) such that the boundary region then has the shape of a square. In certain applications, square signal constellations are not desirable, since they have a higher two-dimensional peak-to-average power ratio (PAR) than constellations with more circular boundaries. More importantly, square constellations are not suitable for representing fractional bits per symbol and require a method known as constellation switching to allow fractional rate transmission, which further increases the two-dimensional PAR. In trellis precoding, it is possible to find precoding lattices whose Voronoi region is more circular than that of a square and which can accommodate certain fractional data rates. However, this approach is not very flexible, since it does not uniformly handle all fractional data rates and is more difficult to make invariant to 90° phase rotations, which is an important requirement in certain practical applications. Another drawback of trellis precoding is that to achieve shaping gain, the precoding operation must be combined with shaping operations, which increases the complexity of implementation.

There is a need for a flexible precoding method and device that can work with substantially any signal constellation at substantially any data rate and that can be implemented independently from constellation shaping while achieving an overall performance that is at least comparable to that of trellis precoding.

SUMMARY OF THE INVENTION

A device and method are set forth for mapping a digital data sequence into a signal point sequence x(D) for transmission over a channel characterized by a nonideal response h(D) using a trellis code C, comprising a signal point selector (precoding unit) for selecting said signal point sequence x(D) from a subset of all possible signal point sequences that are of a form u(D)+d(D), wherein u(D) is a signal point sequence from a translate of said trellis code C and uniquely represents said digital data sequence and wherein d(D) represents a nonzero difference between a selected nonzero code sequence c(D) from said trellis code C and a postcursor intersymbol interference (ISI) sequence p(D) substantially of a form p(D)=x(D)[h(D)−1], such that c(D) is selected based only upon p(D).

DETAILED DESCRIPTION OF A PREFERRED EMBODIMENT

The method and device of the present invention permits precoding an arbitrary stream of signal points for transmission over a digital communication channel, performing particularly well on channels having severe attenuation distortion. Substantial benefits are obtained by utilizing the present invention: transmission at substantially any desired data rate without constellation switching, transmission with circular signal constellations, and simplification of shaping by completely separating shaping from precoding.

Figure 1:
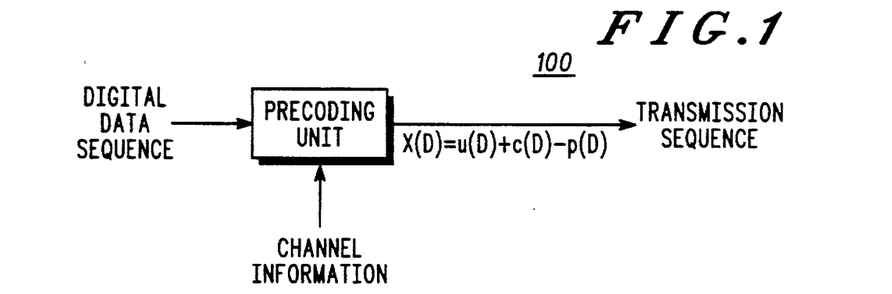
FIG. 1 is a block diagram of a device in accordance with the present invention.

As illustrated in FIG. 1, a device in accordance with the present invention (precoding unit, 100) precodes a digital data sequence to provide a precoded sequence x(D) for transmission over a discrete time channel unit (defined below) with a complex impulse response h(D). A key characteristic of the invention is that the precoded sequence x(D) can be represented by the sum $$x(D)=u(D)+d(D)$$

where u(D) is a signal point sequence from a translate of a trellis code C and represents the digital data sequence and d(D) is a dither sequence that may be represented as $$d(D)=c(D)-x(D)[h(D)-1]$$

where c(D) is a code sequence from a trellis code C. The code C can be any n-dimensional trellis code, where n is an integer, based on a lattice partition $\Lambda/\Lambda'$, where $\Lambda$ is a selected lattice, and $\Lambda'$ is a selected sublattice of $\Lambda$. The individual signal points $u_k$, k=1, 2, ..., of u(D) are chosen from a translate of a two-dimensional lattice $\Lambda_2$ and from within a finite two-dimensional region R.

Two key features distinguish the invention from prior art: (i) the sequence c(D) is not the all-zero sequence (when c(D)=0, the technique reduces to a known transmitter linear equalization technique), and (ii) the selection of c(D) is based only upon the post-cursor ISI sequence p(D), in contrast to more conventional precoding techniques where c(D) is selected based upon both p(D) and u(D).

Typically, the present invention is utilized where the complex impulse response h(D) has no zeroes on the unit circle, or equivalently, when its inverse, 1/h(D), is stable. Therefore, the following embodiments utilize an h(D) that is a canonical response with a stable inverse. Note that h(D) may be an allzero response such as h(D)=1+0.75 D, an all-pole response such as h(D)=1/(1−0.75 D), or a more general response that includes zeroes and poles. As in classical precoding techniques, it is assumed that the response h(D) has been determined and is known at the transmitter.

Figure 2:
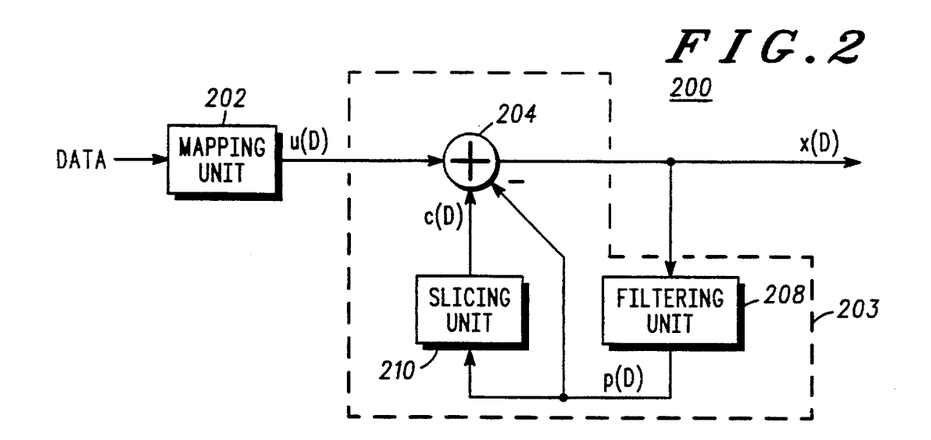
FIG. 2 is a more detailed block diagram illustrating a first embodiment of a device in accordance with the present invention.

FIG. 2, numeral 200, is a more detailed block diagram of a first embodiment of a precoding device in accordance with the present invention. Here the digital data sequence is first mapped in a mapping unit (202) into a signal point sequence u(D) chosen from a translate of a trellis code C using any combination of known encoding, mapping and shaping techniques. This embodiment also comprises a first combining unit (204) and a filtering-slicing unit (206) together forming a unit (203) that generates x(D) from the signal point sequence u(D). The first combining unit (204), typically a summer, is operably coupled to receive the signal point sequence u(D), a code sequence c(D) and a post-cursor ISI sequence p(D)=x(D)[h(D)−1] and provides the transmission sequence x(D)=u(D)+c(D)−p(D). The difference between x(D) and u(D) is the dither sequence d(D)=x(D)−u(D)=c(D)−p(D). A filtering unit (208) is operably coupled to receive the transmitted sequence x(D) to provide the post-cursor ISI sequence p(D).

In all embodiments that follow, the slicing unit (210) is utilized for slicing (on a symbol-by-symbol basis) the post cursor ISI sequence p(D) to an allowable code sequence c(D) selected from the trellis code C. The code sequence c(D) can be selected in many different ways. For a two-dimensional trellis code C, in one embodiment, the symbols $c_k$ of the sequence c(D) are selected from the sublattice $\Lambda'$. This ensures that c(D) will belong to the trellis code C. In another embodiment, the symbols $c_k$ are selected on a symbol-by-symbol basis by following a single path in a trellis representation of C. The operation of the slicing unit (210) for multi-dimensional trellis codes will be described later.

Typically the symbols $c_k$ will be chosen on a symbol-by-symbol basis to minimize the instantaneous energy of the dither symbols $d_k=c_k-p_k$. Since the filtering unit (208) has a delay of at least one time unit, the elements $p_k$ of the postcursor ISI sequence p(D) depend only upon past values $x_i$, i<k of the transmitted sequence x(D). Therefore, the current dither symbol $d_k$ will be statistically uncorrelated from the current signal point $u_k$ (assuming u(D) is itself an uncorrelated sequence). Therefore, the energy of the transmitted symbols $S_x=E\{|x_k|^2\}$ will be the sum $S_u+S_d$ of the energies of u(D) and d(D), where E is a statistical expectation. The average energy $S_x$ of the transmitted sequence x(D) will be approximately the same as the energy $S_u$ of the signal sequence u(D) as long as the average dither energy $S_d$ is small. That means, the better the approximation c(D)≈p(D) is, the smaller will be the increase in average energy due to the dither sequence d(D).

It should be noted, however, that the invention is not limited to criteria that minimize the instantaneous dither energy, and any criterion can be used to select the code sequence c(D) as long as the selection of each $c_k$ is based only upon past values $x_i$, i<k, of x(D). For example, in certain applications it may be desirable to limit the range of the channel output symbols $y_k=u_k+c_k$. This can be achieved, at the expense of a higher dither energy $S_d$, by restricting the values of $c_k$ to a certain range. Also, when the present precoding method is used with a multi-level code, the selection of $c_k$ may be further restricted so that certain parity-check conditions are satisfied.

Figure 3:
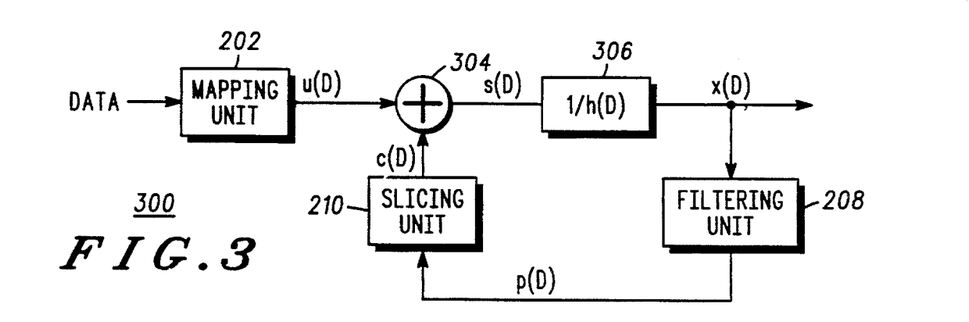
FIG. 3 is a block diagram of a second embodiment of a device in accordance with the present invention.
Figure 4:
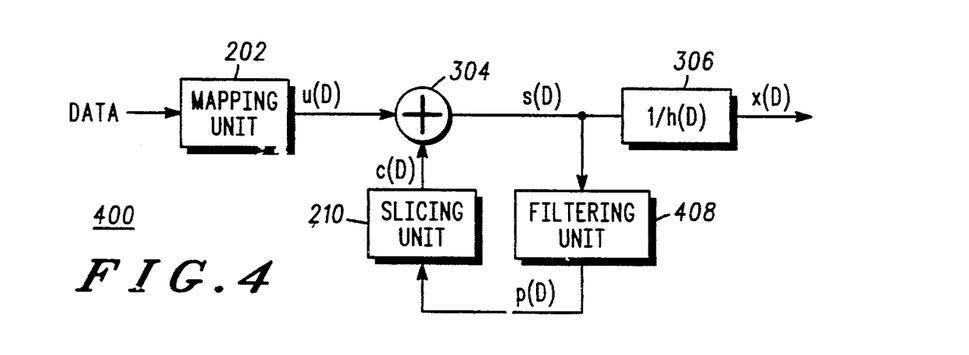
FIG. 4 is a block diagram of a third embodiment of a device in accordance with the present invention.
Figure 5:
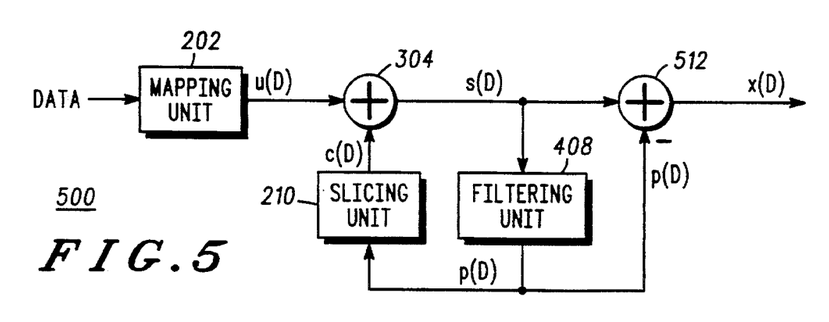
FIG. 5 is a block diagram of a fourth embodiment of a device in accordance with the present invention.

FIGS. 3–5 show three alternative embodiments of the present invention which are substantially equivalent to the first embodiment shown in FIG. 2. FIG. 3, numeral 300, sets forth a block diagram illustrating a second embodiment of a precoding device, in accordance with the present invention. In this embodiment the combining unit (304) is operably coupled to receive the signal point sequence u(D) from the mapping unit (202) and the code sequence c(D) from the slicing unit (210) to form the sequence s(D)

$$s(D)=u(D)+c(D).$$

An inverse filtering unit (306) which is operably coupled to the combining unit (304) to receive the sequence s(D) provides the transmitted sequence x(D) as an output of the precoding unit and as an input to the filtering unit (208) according to x(D)=s(D)/h(D). Since x(D)h(D)=x(D)+p(D)=s(D), it follows that $$\begin{aligned} x(D) &= s(D)/h(D) \\ &= s(D)-p(D) \\ &= u(D)+c(D)-p(D). \end{aligned}$$

Thus for the same input sequence u(D), this second embodiment will produce essentially the same transmitted sequence x(D) as that of the first embodiment.

A third embodiment of the precoding device is shown in FIG. 4, numeral 400. Here the filtering unit (408) is operably coupled to the first combining unit (304) such that the post-cursor ISI sequence p(D) is generated directly from the sequence s(D) instead of the transmitted sequence x(D), and the filtering unit (408) has the response {1−1/h(D)}. It should be noted that since x(D)=s(D)/h(D), and $$p(D)=s(D)\{1-1/h(D)\}=x(D)\{h(D)-1\}$$

the filtering unit (408) in this embodiment will produce the same post-ISI sequence p(D) as the earlier embodiments, and therefore the same transmitted sequence x(D) will be generated as in the earlier embodiments, again assuming the same input sequence u(D). Other operable couplings for the third embodiment are as described for FIG. 3.

A fourth embodiment shown in FIG. 5, numeral 500, is similar to that in FIG. 4, except that here the inverse filtering operation x(D)=s(D)/h(D) is implemented according to $$x(D)=s(D)-p(D)$$

where a second combining unit (+512), operably coupled to the first combining unit (304) and to the filtering unit (408), substantially subtracts the post-cursor ISI sequence p(D) provided by the filtering unit (408) from the sequence s(D) provided by the first combining unit (304).

The above description utilizes an assumption that the channel is characterized by a discrete-time complex impulse response h(D). It is well-known in the state-of-the-art that any discrete time or continuous-time linear passband channel with additive noise can be represented by a canonical discrete-time equivalent channel with a causal ($h_k=0$, $k<0$), minimum-phase (all zeros outside or on the unit circle), monic ($h_o=1$) impulse response h(D) and additive white noise w(D). A canonical receiver front-end that includes a whitened matched filter and a sampler (in the case of continuous-time channels) operating at a selected symbol rate may be utilized to provide such an equivalent channel. It should be mentioned that in practice, typically, h(D) represents the combined effect of the filters in the transmitter, channel, the receiver, and a sampler. Similarly, w(D) represents the noise after it passes through the receive filters and the sampler. The whitened-matched filter reduces the strength of the distortion through proper filtering and therein lies the performance advantage of the present invention over conventional linear equalizations.

In practice, when h(D) is an all-zero response, a whitened matched filter can be determined adaptively using standard adaption techniques for decision-feedback equalizers. When it is desired that h(D) be an all-pole filter, then one can first determine adaptively an all-zero response h'(D) using the standard methods and then find h(D)=1/g'(D) using well-known polynomial division techniques, where g'(D) is a finite polynomial approximately equal to g'(D)≈1/h'(D).

Figure 6:
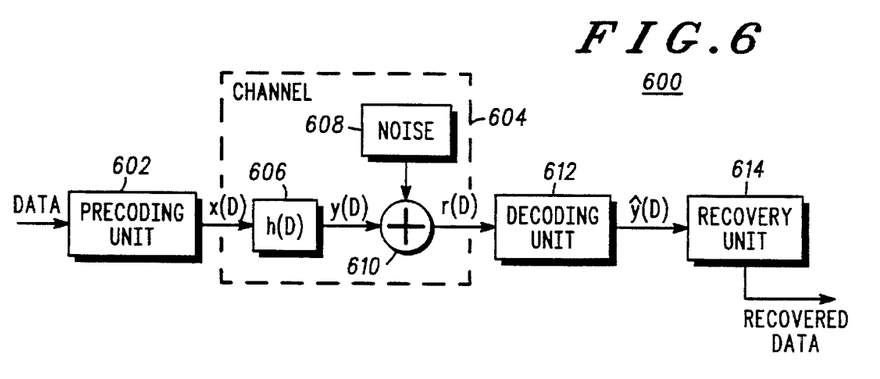
FIG. 6 is a block diagram of a first embodiment of a digital communication system utilizing a device in accordance with the present invention.

A first embodiment of a device of the present invention incorporated into a digital communication system is illustrated in the block diagrams of FIG. 6, numeral 600, wherein at least one of a transmission unit and a receiving unit utilizes the present invention. The said system typically includes at least one of a transmission unit and a receiving unit wherein the transmission unit has a precoding unit (602) (typically in a transmitter) for transmitting a digital data sequence and a channel (604) obtained as described in the above paragraph, operably coupled to the precoding unit (602), for facilitating transmission of the precoded sequence x(D), and the receiving unit has a decoding unit (612), operably coupled to the channel unit (604), for receiving and decoding a received sequence r(D) to provide an estimated output sequence ŷ(D), and a recovery unit (614), operably coupled to the decoding unit (612), for substantially recovering an estimate û(D) of the signal point sequence u(D). An estimate of the transmitted digital data sequence is then found from û(D) using an inverse map and shaping recovery (if constellation shaping is employed).

The equivalent channel (604), represented as set forth above, is substantially represented by a filter having a response h(D) (606), for receiving x(D) and producing an output sequence y(D)=x(D)h(D) substantially equal to s(D), defined earlier, an additive noise unit (608) for providing additive noise, and a combining unit (610), typically a summer, operably coupled to the h(D) unit (606) and to the additive noise unit (608).

The decoding unit (612) is typically a decoder for the trellis code C, as is known in the art. The decoding unit (612), typically receives and decodes a noisy received sequence r(D) which is of a form $$r(D) = x(D)h(D) + w(D)$$
$$= y(D) + w(D)$$
$$= u(D) + c(D) + w(D),$$

to provide an estimate ŷ(D) of the channel output sequence y(D)=x(D)h(D), and a recovery unit (614), operably coupled to the decoding unit (612), substantially recovers an estimate û(D) of the input sequence u(D), described more fully below.

Since c(D) belongs to the trellis code C, the sequence y(D)=u(D)+c(D) must be a sequence in the same translate of C as the signal point sequence u(D). Of course, since $c_k$ can be large, the symbols $y_k=u_k+c_k$ of y(D) will lie within a boundary region that is larger than the region R defined earlier for the symbols $u_k$ of u(D). That means that the sequence y(D) can be estimated by a conventional decoder (612) for C, as is known in the art, with the provision that it searches over a larger (possibly infinite) range of signal points.

Note that a conventional receiver will not take advantage of the correlation between successive channel output signals $y_k$. To see this, note that it is possible to construct augmented trellis diagrams using the fact that $y_k=u_k+c_k$, and $c_k$ depends on past values of $y_k$. If for example, h(D) is an all-pole response of order m, then $c_k$ will depend on a finite number of recent symbols $y_{k-i}$, $i=1, \ldots, m$ (where m is a selected integer). Therefore, a sequence estimator can be defined by combining the state of the input sequence u(D) and the channel state $s_k=[y_{k-1}, y_{k-2}, \ldots, y_{k-m}]$. Since such a trellis can have an excessively large number of states, and therefore will be difficult to search, reduced-complexity search techniques can be employed to achieve nearly the same performance at substantially reduced complexity. The number of states in an ML trellis can be reduced using state merging techniques for reduced-state sequence estimation (RSSE).

A simplest form RSSE involves a search over the trellis of the trellis code C, and operates like a conventional decoder except it uses the path history of each surviving sequence to find an estimate $ĉ_k$ of the code variables $c_k$. It is important to note that a different estimate $ĉ_k$ is used for each state of the trellis, and the estimate associated with each state is used to compute the branch metrics for all branches that leave that state. Given an estimate $ĉ_k$ allows determination of an estimated range R+$ĉ_k$ for the signal points $y_k=u_k+ĉ_k$ and this limited range is used in the all branch metric computations for that estimate. The disadvantage of this technique is that it increases the computational complexity since it requires considerably more branch metric calculations. The complexity can reduced, however, by using only a more likely subset of the possible states to form the estimates $ĉ_k$.

Figure 7:
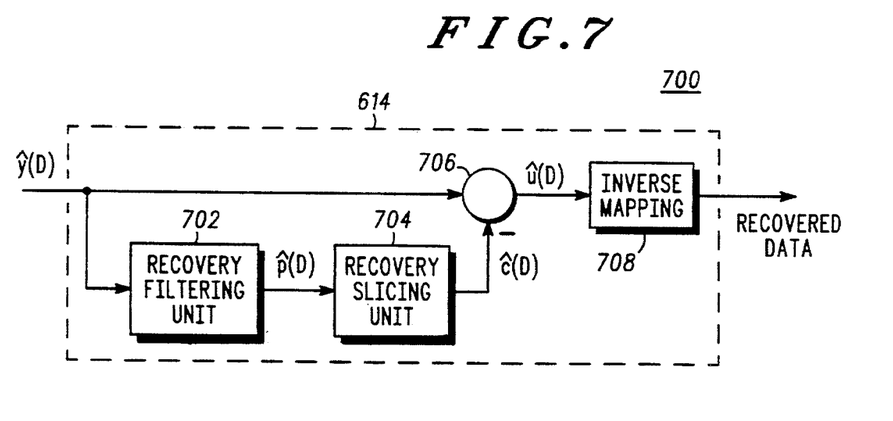
FIG. 7 is a block diagram of a recovery unit of the digital communication system of FIG. 6, showing the recovery unit with more particularity.

The recovery unit (614), illustrated with more particularity in the block diagram of FIG. 7, numeral 700, typically includes at least a recovery filtering unit (702), operably coupled to the estimated output sequence ŷ(D), for filtering ŷ(D) to obtain an estimate p(D) of the precursor ISI sequence p(D), substantially of a form p̂(D)=ŷ(D){1=1/h(D)}, a recovery slicing unit (704), operably coupled to the recovery filtering unit (702), for slicing p̂(D) to provide a recovery code sequence ĉ(D) from the trellis code C, in a manner that is substantially the same as that used in the precoding unit at the transmitter, and a recovery combining unit (706), operably coupled to the recovery slicing unit (704) and to the decoding unit (612), for substantially determining a difference between the output sequence ŷ(D) and the sequence ĉ(D) to obtain the estimate u(D) of the original input sequence u(D). As long as there are no decision errors (ŷ(D)=y(D)), and the operations in the transmitter and receiver are substantially symmetrical, the original sequence u(D) will be correctly recovered. Other equivalent implementations of the recovery circuit are also possible.

To summarize, the recovery filtering unit (702) is utilized to reconstruct an estimate $p̂_k$ of a post-cursor intersymbol interference variable $p_k$, then the recovery slicing unit (704) is utilized to determine a symbol $ĉ_k$ belonging to a sublattice $\Lambda'$ (or an allowable coset of $\Lambda'$) on a symbol-to-symbol basis to form a sequence $\hat{c}(D)$ that substantially correlates with $c(D)$ in the precoding unit (100) at the transmitter, and then utilize the recovery combining unit (706) to provide $\hat{u}(D) = \hat{y}(D) - \hat{c}(D)$.

Of course, there will be occasional errors in $\hat{y}(D)$ due to channel noise, and these may lead to error propagation. However, since $1/h(D)$ is stable, the error propagation in the filter $1 - 1/h(D)$ will never be catastrophic. Moreover, if $h(D)$ is an all-pole response of order m (where m is a selected integer), then error propagation will be strictly limited to at most m symbols.

In an embodiment where the elements $c_k$ of the sequence $c(D)$ are chosen on a symbol-by-symbol basis at the transmitter by following a path through the trellis of the code C, during recovery, occasional errors may cause loss of the correct state thereby causing loss of synchronization, which may continue for a long time if not corrected. One way to circumvent this problem is to force $c(D)$ in the transmitter to a known state of the trellis at every Lth symbol, where L is a preselected integer, to reestablish synchronization in the receiver at an expense of a slight increase in the transmit energy.

Where an estimate $\hat{u}_k$, a kth variable of the recovered sequence $u(D)$, falls outside the allowed range R of a kth variable $u_k$ of the input sequence $u(D)$, such a range violation indicates that a decision error has occurred either in the current symbol $y_k$, or $c_k$ is in error because of an error in some recent symbol $y_{k-i}$, i>0. When such range violations are detected, one can try to correct them by adjusting the estimates $y_k$ or $y_{k-i}$. Thus, by monitoring the range violations, some degree of error correction can be achieved. Such an error detection capability can also be useful for monitoring the performance of the transmission system.

Figure 8:
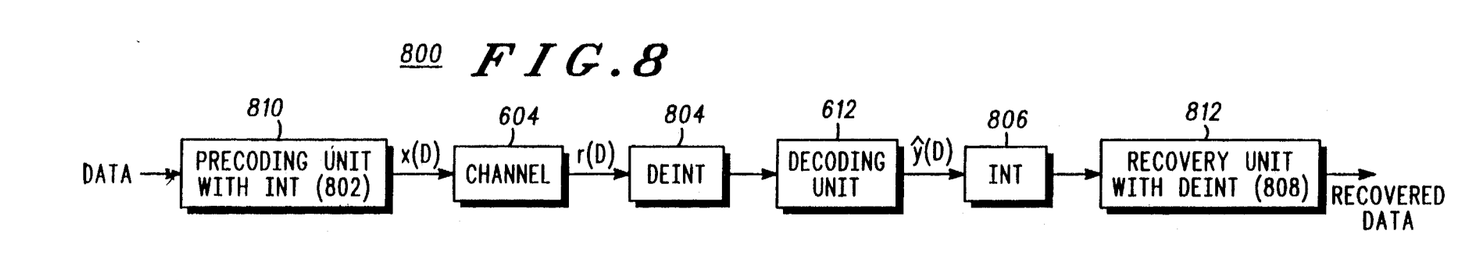
FIG. 8 is a block diagram of a second embodiment with interleaving of a digital communication system utilizing a device in accordance with the present invention.

A second embodiment of a digital communication system having a device in accordance with the present invention, the system including interleaving, is illustrated in FIG. 8, numeral 800. In certain applications, an interleaver INT (802) may be included in a precoding unit (810). The precoding unit (810) is the same as the precoding unit (100), except that the precoding unit (810) further includes an interleaver such that the signal point sequence $u(D)$ is now replaced by an interleaved signal point sequence $u'(D)$ which is obtained by passing $u(D)$ through the interleaver (802). The interleaver will allow the removal of potential correlation between successive noise samples at the output of the channel. The interleaver (802) can be any device with a realizable inverse (deinterleaver) that changes the ordering of the input symbols. For example, in a periodic interleaver, input samples are delayed according to a sequence of delays that are periodic with same period P. As described above for FIG. 6, $x(D)$ and $r(D)$ are generated.

In the receiver, the received noisy sequence $r(D) = u'(D) + c(D) + w(D)$ is deinterleaved prior to decoding by passing $r(D)$ through a deinterleaver DEINT (806), operably coupled to receive $r(D)$, to obtain the deinterleaved received sequence $r'(D) = u(D) + c'(D) + w'(D)$, where $w'(D)$ is the noise sequence whose order has been shuffled in the deinterleaver (804). It is this shuffling of the noise that produces improved performance when the channel noise is bursty or correlated. Note that the deinterleaver (804) recovers the original ordering for the signal point sequence $u(D)$, but in the process it changes the ordering of the code symbols $c_k$ added in the precoding device at the transmitter. It is essential that the shuffled code sequence $c'(D)$ is a code sequence in the trellis code C, so that the decoding unit (612), typically a conventional Viterbi decoder for C, operably coupled to the deinterleaver (804), can recover the original sequence $y(D) = u(D) + c'(D)$. For a two-dimensional trellis code C this is always ensured if the elements $c_k$ are chosen from the sublattice $\Lambda'$ on a symbol-by-symbol basis and with no memory.

To recover the original input sequence $u(D)$, the estimated sequence $\hat{y}(D)$ from the decoder for C must be interleaved once again by passing $\hat{y}(D)$ through a second interleaver INT (806), which is operably coupled to the decoding unit (612) and which is substantially equivalent to the interleaver (802) in the transmitter, to recover the original ordering of the code symbols $c(D)$. Interleaving provides $\hat{y}'(D) = \hat{u}'(D) + \hat{c}(D)$. The recovery unit (614), as further illustrated in FIG. 7, operably coupled to the second interleaver (806), receives $\hat{y}'(D)$ and provides an estimate $\hat{u}'(D)$ for the interleaved sequence $u'(D)$. An estimate $\hat{u}(D)$ of the original signal point sequence $u(D)$ is then obtained by passing $\hat{u}'(D)$ through a second deinterleaver DEINT (808) that is included in the recovery unit (614). Recovery unit (812) shown in FIG. 8 is the same as recovery unit (614) except that it includes the deinterleaver (808) that is operably coupled to the recovery combining unit (706) and provides a deinterleaved estimated signal point sequence $\hat{u}(D)$ for the inverse mapping device (708).

Thus, a digital communications receiver may be utilized in accordance with the present invention for receiving a digital data sequence that was mapped into a signal point sequence $x(D)$ and transmitted over a channel characterized by a nonideal response $h(D)$ using a trellis code C, providing a received sequence $r(D)$, comprising at least decoding means, operably coupled to receive $r(D)$, for decoding the received transmission sequence $r(D)$ to provide an estimated output sequence $\hat{y}(D)$, and recovery means, operably coupled to the decoding means, for substantially recovering an estimated sequence $\hat{u}(D)$ for a sequence $u(D)$ for a transmitted signal point sequence $x(D)$, selected from a subset of all possible signal point sequences that are of a form $u(D) + d(D)$, wherein $u(D)$ is a signal point sequence from a translate of said trellis code C and uniquely represents said digital data sequence and wherein $d(D)$ represents a nonzero difference between a selected nonzero code sequence $c(D)$ from said trellis code C and a post-cursor intersymbol interference (ISI) sequence $p(D)$ substantially of a form $p(D) = x(D)[h(D) - 1]$, such that $c(D)$ is selected based only upon $p(D)$.

As illustrated in FIG. 7, one embodiment of the recovery means utilizes a recovery filtering unit (702), operably coupled to receive the estimated output sequence $\hat{y}(D)$, for providing an estimated post-cursor intersymbol interference (ISI) sequence $\hat{p}(D)$, a recovery slicing unit (704), operably coupled to the recovery filtering means, for providing an estimated nonzero code sequence $\hat{c}(D)$ from said trellis code C that substantially correlates with $c(D)$ utilized for providing the transmission sequence $x(D)$, a third combining unit (706) (typically a summer), operably coupled to receive the estimated output sequence $\hat{y}(D)$ and to the recovery slicing means, for determining the estimated sequence $\hat{u}(D)$, substantially of a form $\hat{u}(D) = \hat{y}(D) - \hat{c}(D)$, and an inverse mapping unit (708), operably coupled to the third combining means, for inverse mapping the estimated sequence $\hat{u}(D)$ to provide a recovered digital data sequence substantially equal to the transmitted digital data sequence. The receiver further includes, where the signal point sequence $u(D)$ was interleaved before transmission, a first deinterleaving unit DEINT (804), operably coupled to receive $r(D)$, for providing a deinterleaved $r(D)$ sequence to the decoding unit (612), an interleaving unit INT (806), operably coupled to the decoding unit (612), for providing an interleaved estimate of the decoded sequence, ŷ'(D), to the recovery unit (812), and wherein the recovery unit (812) further includes a second deinterleaving unit (808). The digital communications receiver is utilized as further described above.

In addition the digital communications receiver may be selected such that the decoding unit (612) further includes a reduced complexity sequence estimator unit that utilizes a correlation between successive symbols $y_k$. In one implementation, the reduced complexity sequence estimator unit utilizes a sequence estimator having a reduced number of states that are determined utilizing state merging techniques for reduced-state sequence estimation (RSSE).

Where desired, the recovery unit may be selected to include a range violation determiner unit. When a kth variable $û_k$ of the recovered sequence û(D) is outside a range R (a range violation), this unit adjusts at least one of an estimate $ŷ_k$ and a past estimate $ŷ_{k-i}$ (where i is a positive integer) to substantially correct the range violation.

The present invention may also be utilized with multi-dimensional codes. For example, if u(D) is an arbitrary complex sequence from a translate of a four-dimensional trellis code C based on a four-dimensional (4D) lattice partition $Z^4/RD_4$, the sequence c(D) can be selected as follows. First it should be noted that the sublattice $RD_4$ can be represented as a union of the 4D lattice $2Z^4$ with its coset $2Z^4-(1,1,1,1)$. Moreover, the 4D lattice $2Z^4$ can be obtained by taking a Cartesian product of the two-dimensional (2D) lattice $2Z^2$ which consists of all pairs of even integers. Therefore $RD_4$ can be represented as $$RD_4=(2Z^2 x 2Z^2)U[2Z^2+(,1)]x[2Z^2+(,1)],$$

where U represents the union and x represents the Cartesian product. The union of the 2D lattice $2Z^2$ with its coset $2Z^2+(1,1)$ forms the 2D lattice $RZ^2$.

Therefore, the slicing unit (202) for precoding may select the code sequence c(D) by selecting, in the even symbol interval k, its symbol $c_k$ from $RZ^2$. If $c_k$ belongs to $2Z^2$ then in the following odd symbol interval, the second symbol $C_{k+1}$ is selected from the even integer lattice $2Z^2$. If $c_k$ belongs to the coset $2Z^2+(1,1)$, however, then in the next odd symbol interval, the second symbol $c_{k+1}$ is selected from the coset $2Z^2+(1,1)$. This way it is ensured that the 4D symbol $(c_k, c_{k+1})$ will belong to $RD_4$.

Alternatively, the sequence c(D) may be selected by following the best path through the trellis of the multi-dimensional code. For example, in the case of a popular 4D 16-state trellis code disclosed by Wei (*Trellis-coded Modulation With Multi-dimensional Constellations*, by L. F. Wei, IEEE Transactions on Information Theory, Vol. IT-33, pp. 483–501, July 1987), in the even symbol interval, the closest symbol $c_k$ on the integer lattice $Z^2$ can be selected. In the following odd symbol interval, the closest symbol in either $RZ^2$ or its coset $RZ^2+(1,0)$ is selected, depending on the current state of the path and depending on whether $c_k$ belongs to $RZ^2$ or its coset $RZ^2+(1,0)$. This way, the dither variable $d_k$ is forced to lie inside the Voronoi region of $Z^2$ for the first symbol, and the Voronoi region of $RZ^2$ for the second symbol. In the alternative c(D) selection described above, a single error can propagate indefinitely in the reconstruction causing errors in the selection of the second symbol $c_{k+1}$, since state information may be lost, and it may not be possible to correctly determine whether $c_{k+1}$ will lie in $RZ^2$ or its coset $RZ^2+(1,0)$. As stated above, this problem can be avoided by forcing the trellis to the all-zero state every Lth (L even) symbol interval. During the symbol intervals, where the forcing takes place, the symbols will be selected from specific cosets of $2Z^2$ and therefore the dither variable $d_k$ will lie in the Voronoi region of $2Z^2$ in the second symbol, thereby slightly increasing the dither energy.

Figure 9:
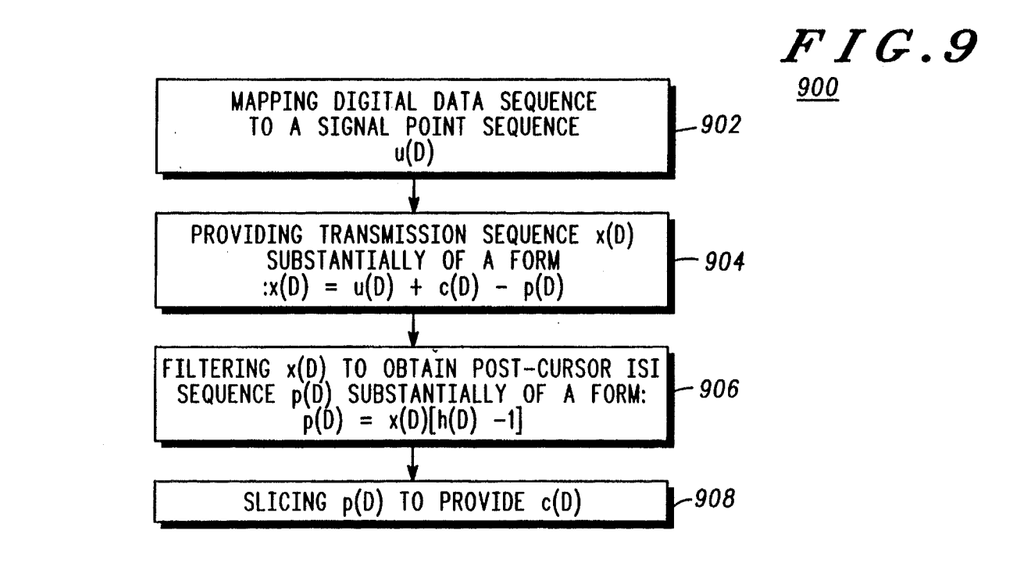
FIG. 9 is a flow diagram setting forth steps in accordance with the method of the present invention.

FIG. 9, numeral 900, sets forth a flow diagram illustrating steps in accordance with the method of the present invention for precoding a stream of signal points for transmission in a digital communication system. The method provides for precoding a digital data sequence to generate a sequence x(D) for transmission over a discrete-time channel with a impulse response h(D). A stream of signal points u(D) chosen from some translate of a trellis code C is transmitted as x(D)=u(D)+d(D), where d(D) is a dither sequence of a form d(D)=c(D)-p(D), where p(D) represents a post-cursor intersymbol interference (ISI), and c(D) is a code sequence, where c(D) is different from an all-zero sequence and is obtained from an untranslated version of the trellis code C based only upon p(D). In one embodiment, the method comprises the steps of mapping the digital data sequence to a signal point sequence u(D) (902), summing u(D), a selected code sequence c(D) and a post-cursor ISI sequence p(D) to obtain the transmission sequence x(D)=u(D)+c(D)–p(D) (904), filtering x(D) to obtain (906) p(D) substantially of a form:

$$p(D)=x(D)[h(D)-1],$$

and slicing p(D) on a symbol-by-symbol basis to obtain the code sequence c(D) (908). Further modifications of the method may be utilized in accordance with the modifications described more fully above for the device of the present invention.

The present invention may be implemented in a digital communication system where a digital signal processor is utilized to precode a digital data sequence to obtain a sequence x(D) for transmission over a discrete-time channel with an impulse response h(D). The processor typically comprises a program storage medium having a computer program to be executed by the digital signal processor, the program comprising a unit for generating a sequence x(D) wherein x(D) can be represented as the sum u(D)+d(D) of a stream of signal points u(D) chosen from a translate of a trellis code C and a dither sequence d(D)=c(D)–p(D), where c(D) is a sequence from a translate of a trellis code C and where p(D) represents a post-cursor intersymbol interference (ISI) sequence of a form p(D)=x(D){h(D)–1}. The code sequence c(D) is different from an all-zero sequence and is determined based upon only the post-cursor ISI sequence p(D). Further description of the operation of the processor follows that described above.

The present invention relies on past channel output signals to remove a dither sequence d(D) that is added to a input sequence u(D) at the transmitter to form a transmitted sequence, x(D)=u(D)+d(D), the dither sequence being substantially a difference between a post-cursor intersymbol interference p(D) and an appropriate code sequence, c(D), from a trellis code from which the input sequence C is chosen. The present invention may be utilized with virtually any signaling method and at any data rate. Further, the present invention may be utilized independently of constellation shaping techniques; that means u(D) may represent an already shaped sequence whose signal points have a non-uniform Gaussian-like probability distribution.

In the present invention, the dither sequence may increase the average transmit energy. Since in practice, the average transmit energy must be kept constant, the signal x(D) must be scaled down to maintain the same average energy. The increase in the average transmit energy is referred to herein as a dithering loss.

The dithering loss depends on the average energy $S_u$ of the signal point sequence u(D), on whether u(D) is coded or uncoded, and also on the method used in selecting the code sequence c(D). For example, if u(D) is a sequence of symbols selected from an uncoded M×M quadrature amplitude-modulated (QAM) signal constellation (where M is a selected integer, typically a power of two) with an average energy $S_u=(M^2-1)/6$, the transmission rate will be $r=\log_2 M^2$ bits per symbol, and the dither sequence d(D) will have dither variables $d_k$ that are uniformly distributed inside a square of side length one, so that $S_d \approx 1/6$ and $S_x \approx S_u + S_d \approx M^2/6$, where $S_d$ is a dither energy. Thus, the dithering loss is approximately 0.28 dB for M=4 (r=4) and about 0.02 dB for M=16 (r=8), and rapidly approaches zero as M grows. Here, dithering loss is substantially the same as a similar loss known to occur in Tomlinson precoding.

In a second exemplary embodiment, for a sequence of data symbols from an M×M QAM signal constellation, where a sequence u(D) is a sequence of code symbols from a translate $C+(0.5)^2$ of a two-dimensional trellis code C that is based on the lattice partition $Z^2/2Z^2$ and a rate-½ convolutional code, the transmission rate is $r=\log_2 M^2-1$ bits per symbol, and the dither variables $d_k$ are distributed inside a Voronoi region of $\Lambda'=2Z^2$, which is a square of side 2, the dither energy is now four times higher; i.e., $S_d \approx 2/3$ and $S_x \approx (M^2+3)/6$. Thus, the dithering loss is about 1.02 dB for M=4 (r=3), and about 0.07 dB for M=16 (r=7).

Clearly, for the same signal constellation (same M), the dithering loss is higher in the trellis-coded QAM system (second exemplary embodiment) than in the uncoded system (first exemplary embodiment). However, as M gets large, the dithering loss becomes very small in both cases. Also, it should be noted that when compared at a same data rate, the difference in the dithering loss is smaller.

In a third exemplary embodiment, for a sequence u(D) of data symbols from an M×M QAM signal constellation that is generated by a trellis shaping system with about 1 dB shaping gain and a shaping constellation expansion factor of 2, wherein a transmission rate for the otherwise uncoded system is $r=\log_2 M^2-1$ bits per symbol. The dithering energy is substantially $S_d \approx 1/6$ and $S_u \approx (M^2-1)/15$. Thus, $S_x \approx M^2/15 + 0.1$, and the dithering loss is substantially 0.67 dB for M=4 ($r_3=3$) and 0.04 for M=16 ($r_3=7$). Hence, shaping increases the dithering loss only very slightly.

A fourth exemplary embodiment illustrates implementation of the present invention to provide reduction of dithering loss while incurring slightly higher computational complexity. In this case, the input sequence is the same as in the second exemplary embodiment, but the method of slicing for determining c(D) is different. Here c(D) is selected on a symbol-by-symbol basis as described above from appropriate cosets of the so-called time-zero lattice $\Lambda_0=RZ^2$ by following the trellis associated with the trellis code. In this case, the dithering variable is uniformly distributed inside the Voronoi region of $RZ^2$, and hence $S_d \approx 1/3$, and therefore the dithering loss will be only 0.54 dB for M=4 and 0.03 dB for M=16.

Although several exemplary embodiments are described above, it will be obvious to those skilled in the art that many alterations and modifications may be made without departing from the invention. For example, even though primarily trellis codes are described above, the method can be used with block or lattice codes as well. The trellis code can be trivial as in an uncoded system. It can also be used with selected multi-level trellis codes. Also, although two-dimensional (passband, quadrature) transmission systems are emphasized, the methods can also be applied to one-dimensional (baseband) or higher-dimensional (parallel channels) transmission systems. Accordingly, it is intended that all such alterations and modifications be included within the spirit and scope of the invention as defined in the appended claims.

I claim:

1. A device for mapping a digital data sequence into a signal point sequence x(D) for transmission over a channel characterized by a nonideal response h(D) using a trellis code C, comprising:

a precoding unit for selecting said signal point sequence x(D) from a subset of all possible signal point sequences that are of a form u(D)+d(D), wherein u(D) is a signal point sequence from a translate of said trellis code C and uniquely represents said digital data sequence and wherein d(D) represents a nonzero difference between a preselected nonzero code sequence c(D) from said trellis code C and a post-cursor intersymbol interference (ISI) sequence p(D) substantially of a form p(D)=x(D)[h(D)−1], such that c(D) is selected based only upon p(D) wherein the precoding unit comprises:

mapping means, for mapping the digital data sequence into said signal point sequence u(D) selected from a translate of said trellis code C, and means for generating said x(D), operably coupled to the mapping means, for altering signal point sequence u(D) to provide said x(D).

2. The device of claim 1 wherein the means for generating x(D) of the precoding unit comprises at least:

first combining means, operably coupled to the mapping means and to a slicing means, for combining u(D) and the code sequence c(D) to provide a combiner output sequence s(D), wherein the slicing means is operably, coupled to a filtering means, and is utilized for slicing the post-cursor sequence p(D) to a selected code sequence of said signal points c(D) selected from the trellis code C, and wherein the filtering means is operably coupled to the first combining means, and is utilized for extracting the post-cursor ISI sequence p(D) from the signal s(D) outputted from the first combining means.

3. The device of claim 2 wherein the first combining means is a summer.

4. The device of claim 2 wherein the first combining means is selected to be operably coupled to the mapping means and to the slicing means further including an inverse filtering means, operably coupled to receive s(D) from the first combining means and to provide s(D)/h(D) to the filtering means, is further included for providing a transmission sequence x(D) substantially of a form s(D)/h(D).

5. The device of claim 2 wherein the precoding unit further includes second combining means, operably coupled to the first combining means and to the filtering means, for providing the transmitted sequence x(D) substantially of a form x(D)=s(D)− p(D).

6. The device of claim 5 wherein the second combining means is a summer.

7. The device of claim 2 wherein the mapping unit includes constellation shaping.

8. The device of claim 2 wherein the precoding unit further includes an interleaving means for interleaving to facilitate a removal of potential correlation between successive noise samples at the output of the channel.

9. The device of claim 2, wherein the precoding unit further includes second combining means, operably coupled to the first combining means and to the filtering means, for providing the transmitted sequence x(D) substantially of a form x(D)=s(D)−p(D).

10. The device of claim 2 wherein the first combining means is selected to be operably coupled to the mapping means and to the slicing means further including an inverse filtering means, operably coupled to receive said s(D) from the first combining means where the first combining means also provides said s(D) to the filtering means in a feedback loop wherein the filtering means provides said p(D) to the slicing means which provides said c(D) to the first combining means, and the inverse filtering means is further included for providing a transmission sequence x(D) substantially of a form s(D)/h(D).

11. The device of claim 1 wherein the means for generating x(D) of the precoding unit comprises at least:

first combining means, operably coupled to the mapping means, to a slicing means, and to a filtering means, for combining said u(D), the code sequence c(D) and the postcursor ISI sequence p(D) to provide the transmission sequence x(D), wherein the slicing means is operably coupled to the filtering means, and is utilized for slicing the post-cursor ISI sequence p(D) to a selected code sequence of said signal points c(D) selected from the trellis code C, and wherein the filtering means is operably coupled to the first combining means, and is utilized for extracting the post-cursor ISI sequence p(D) from the transmission sequence x(D).

12. The device of claim 11 wherein the first combining means is a summer.

13. The device of claim 1 wherein the precoding unit comprises at least:

mapping means, for mapping the digital data sequence into said signal point sequence u(D) selected from a translate of a trellis code C, first combining means, operably coupled to the mapping means and to a slicing means, for combining said u(D) with at least the code sequence c(D) from the slicing means to provide a combiner output sequence s(D), an inverse filtering means, operably coupled to the first combining means, for providing a transmission sequence substantially of a form x(D) =s(D)/h(D) to a filtering means, and the filtering means, operably coupled to the inverse filtering means, for extracting the post-cursor ISI sequence p(D) from the transmission sequence x(D), wherein the slicing means is operably coupled to the filtering means, and is utilized for slicing the post-cursor sequence p(D) to said code sequence c(D) selected from the trellis code C.

14. The device of claim 13 wherein the first combining means is a summer.

15. The device of claim 1 wherein the precoding unit comprises at least:

mapping means, for mapping the digital data sequence into a signal point sequence u(D) selected from a translate of a trellis code C, first combining means, operably coupled to the mapping means and to a slicing means, for combining u(D) with at least the code sequence c(D) from the slicing means to provide a combiner output sequence s(D), and an inverse filtering means, operably coupled to receive said s(D) from the first combining means where the first combining means also provides said s(D)to a filtering means in a feedback loop wherein said filtering means provides p(D) to the slicing means which provides c(D) to the first combining means, and the inverse filtering means is utilized for providing a transmission sequence substantially of a form x(D)=s(D)/h(D), wherein the slicing means is operably coupled to the filtering means, and is utilized for slicing the post-cursor sequence p(D) to a selected code sequence of signal points c(D) selected from the trellis code C, and wherein the filtering means is operably coupled to the first combining means, and is utilized for extracting the post-cursor ISI sequence p(D) from the combiner output sequence s(D).

16. The device of claim 15 wherein the first combining means is a summer.

17. The device of claim 1 wherein the trellis code C may be represented by a trellis diagram having only one state.

18. The device of claim 1 wherein the trellis code C is a block code.

19. The device of claim 1 wherein said u(D)is an arbitrary complex sequence from a translate of an n-dimensional trellis code C based on a partition $\Lambda/\Lambda'$ (i.e., a partition of a lattice $\Lambda$ into its sublattice $\Lambda'$), where n is a selected integer, and the slicing means provides a sequence of symbols from the sublattice $\Lambda'$ as the selected sequence c(D) on a symbol-by-symbol basis.

20. The device of claim 1 wherein the trellis code C is based on a two-dimensional lattice partition $\Lambda/\Lambda'$, and the sequence c(D) is selected from said trellis code C with a zero delay and the selection is dependent from symbol to symbol.

21. The device of claim 20 wherein selection of the sequence c(D) is forced to a known state of the trellis code C at every Lth symbol, where L is a preselected integer.

22. The device of claim 20 wherein said trellis code C is a four-dimensional trellis code based on a partition $Z^4/RD_4$, wherein a sublattice is $RD_4$, and the slicing means provides the selected sequence c(D) from $RD_4$ by selecting a symbol $c_k$ from $RZ^2$ in a first symbol interval, a second symbol $c_{k+1}$ from either $2Z^2$ or its coset $2Z^2+(1,0)$, based on $c_k$, where k is an even integer.

23. The device of claim 1 wherein, the sequence c(D) is preselected such that for each time interval k, an energy $|d_k|^2$ of dither symbols $d_k$ of a dither sequence d(D) is minimized, where, for $d_k=c_k-p_k$ where $c_k$ is a symbol from the sequence c(D) in time interval k and $p_k$ is a symbol from the sequence p(D) in the time interval k.

24. The device of claim 23 wherein, the preselection of $c_k$ further includes constraints to limit a range of symbols $y_k$ in time interval k of a channel output sequence y(D) where y(D)=x(D)h(D).

25. A digital communications receiver for receiving a digital data sequence that was mapped into a signal point sequence x(D) and transmitted over a channel characterized by a nonideal response h(D) using a trellis code C, providing a received sequence r(D), comprising at least:

decoding means, operably coupled to receive said r(D), for decoding the received transmission sequence r(D) to provide an estimated output sequence ŷ(D), and recovery means, operably coupled to the decoding means, for substantially recovering an estimated sequence û(D) for a sequence u(D) for a transmitted said signal point sequence x(D), selected from a subset of all possible signal point sequences that are of a form u(D)+d(D), wherein u(D) is a signal point sequence from a translate of said trellis code C and uniquely represents said digital data sequence and wherein d(D) represents a nonzero difference between a selected nonzero code sequence c(D) from said trellis code C and a post-cursor intersymbol interference (ISI) sequence p(D) substantially of a form p(D)=x(D)[h(D)−1], such that c(D) is selected based only upon p(D).

26. The digital communications receiver of claim 25 wherein the recovery means includes at least:

recovery filtering means, operably coupled to receive the estimated output sequence $\hat{y}(D)$, for providing an estimated post-cursor intersymbol interference (ISI) sequence $\hat{p}(D)$, recovery slicing means, operably coupled to the recovery filtering means, for providing an estimated nonzero code sequence $\hat{c}(D)$ from said trellis code C that substantially correlates with said c(D) utilized for providing the transmission sequence x(D), first combining means, operably coupled to receive the estimated output sequence $\hat{y}(D)$ and to the recovery slicing means, for determining the estimated sequence $\hat{u}(D)$, substantially of a form $\hat{u}(D)=\hat{y}(D)-\hat{c}(D)$, and an inverse mapping means, operably coupled to the first combining means, for inverse mapping the estimated sequence $\hat{u}(D)$ to provide a recovered digital data sequence.

27. The digital communications receiver of claim 25 further including, where the signal point sequence u(D) was interleaved before transmission:

first deinterleaving means, operably coupled to receive said r(D), for providing a deinterleaved r(D) sequence to the decoding means, an interleaving means, operably coupled to the decoding means, for providing an interleaved estimate of the decoded sequence, $\hat{y}'(D)$, to the recovery means, and wherein the recovery means further includes second deinterleaving means.

28. The digital communications receiver of claim 25 wherein one of:

A) said u(D) is an arbitrary complex sequence from a translate of said trellis code C having n dimensions based on a partition $\Lambda/\Lambda'$ where n is a selected integer, and the slicing means provides a sequence of symbols from the sublattice $\Lambda'$ as the selected sequence c(D) on a symbol-by-symbol basis, B) said trellis code C is based on a two-dimensional lattice partition $\Lambda/\Lambda'$, and the sequence c(D) is selected from said trellis code C with a zero delay and is dependent from symbol to symbol, and one of:

1) selection of the sequence c(D) is forced to a known state of said trellis code C at every Lth symbol, where L is a preselected integer, and 2) selection of the sequence c(D) is unforced with respect to every Lth symbol, C) said trellis code C is a four-dimensional trellis code based on a partition $Z^4/RD_4$, wherein the sublattice is $RD_4$, and the slicing means provides the selected sequence c(D) from $RD_4$ by selecting a symbol $c_k$ from $RZ^2$ in a first symbol interval, a second symbol $c_{k+1}$ from either $2Z^2$ or its coset $2Z^2+(1,0)$, based on $c_k$, where k is an even integer, and D) the sequence c(D) is selected such that for each time interval k, an energy $|d_k|^2$ of dither symbols $d_k$ of a dither sequence d(D) is minimized, where, for $d_k=c_k-p_k$ where $c_k$ is a symbol from the sequence c(D) in time interval k and $p_k$ is a symbol from the sequence p(D) in the time interval k and one of:

1) the selection of $c_k$ further includes constraints to limit a range of the symbols $y_k$ in time interval k of a channel output sequence y(D) where y(D)=x(D)h(D), and 2) the selection of $c_k$ is unrestrained with respect to a range of the symbols $y_k$.

29. The digital communications receiver of claim 25 wherein the nonideal response h(D) represents the impulse response of a noise prediction filter.

30. The digital communications receiver of claim 25 wherein, the sequence $\hat{c}(D)$ is selected such that for each time interval k, an energy $|\hat{d}_k|^2$ of dither symbols $\hat{d}_k$ of a dither sequence $\hat{d}(D)$ is minimized, where, for $\hat{d}_k=\hat{c}_k-\hat{p}_k$ where $\hat{c}_k$ is a symbol from the sequence $\hat{c}(D)$ in time interval k and $\hat{p}_k$ is a symbol from the sequence p(D) in the time interval k.

31. The digital communications receiver of claim 30 wherein, the selection of $\hat{c}_k$ further includes constraints to limit a range of the symbols $\hat{y}_k$ in time interval k of a channel output sequence $\hat{y}(D)$ where $\hat{y}(D)=x(D)h(D)$.

32. The digital communications receiver of claim 25, wherein the decoding means further includes a reduced complexity sequence estimator means that utilizes a correlation between successive symbols $y_k$ in time interval k of a channel output sequence y(D).

33. The digital communications receiver of claim 32 wherein the reduced complexity sequence estimator means utilizes a sequence estimator having a reduced number of states that are determined utilizing state merging techniques for reduced-state sequence estimation (RSSE).

34. The digital communications receiver of claim 25, wherein the recovery means further includes a range violation determiner for, where a kth variable $\hat{u}_k$ of the recovered sequence $\hat{u}(D)$ is outside a range R (a range violation), adjusting one of an estimate $\hat{y}_k$ and an estimate $\hat{y}_{k-i}$ (where i is a positive integer) to substantially correct the range violation.

35. A method for prerecording a digital data sequence utilizing a signal point sequence u(D) chosen from a translate of a trellis code C for transmission over a discrete-time channel with a impulse response h(D) where p(D) represents a post-cursor intersymbol interference (ISI), and c(D) is a nonzero code sequence of signal points c(D), where c(D) is obtained from an untranslated version of the trellis code C, comprising at least the steps of:

A) mapping the digital data sequence to said signal point sequence u(D);

B) summing said u(D), c(D) and p(D) to provide a transmission sequence x(D) substantially of a form x(D)=u(D)+c(D)−p(D);

C) filtering said x(D) to obtain said post-cursor intersymbol interference (ISI) sequence p(D) substantially of a form p(D)=x(D)[h(D)−1]; and D) said slicing p(D) on a symbol-by-symbol basis to obtain said nonzero code sequence of signal points c(D).

36. The method of claim 35 wherein at least one of:

A) said trellis code C may be represented by a trellis diagram having only one state, B) said trellis code C is a block code, C) said u(D) is an arbitrary complex sequence from a translate of said trellis code C having n dimensions based on a partition $\Lambda/\Lambda'$ where n is a selected integer, and the slicing means provides a sequence of symbols from the sublattice $\Lambda'$ as the selected sequence c(D) on a symbol-by-symbol basis, D) said trellis code C is based on a two-dimensional lattice partition $\Lambda/\Lambda'$, and the sequence c(D) is selected from said trellis code C with a zero delay and is dependent from symbol to symbol, and one of
1) selection of the sequence c(D) is forced to a known state of said trellis code C at every Lth symbol, where L is a preselected integer, and
2) selection of the sequence c(D) is unforced with respect to every Lth symbol, E) said trellis code C is a four-dimensional trellis code based on a partition $Z^4/RD_4$, wherein the sublattice is $RD_4$, and the slicing means provides the selected sequence c(D) form $RD_4$ by selecting a symbol $c_k$ from $RZ^2$ in a first symbol interval, a second symbol $c_{k+1}$ from either $2Z^2$ or its coset $2Z^2+(1,0)$, based on $c_k$, where k is an even integer, and F) the sequence c(D) is selected such that for each time interval k, an energy $|d_k|^2$ of dither symbols $d_k$ of a dither sequence d(D) is minimized, where, for $d_k=c_k-p_k$ where $c_k$ is a symbol from the sequence c(D) in time interval k and $p_k$ is a symbol from the sequence p(D) in the time interval k and one of:
1) the selection of $c_k$ further includes constraints to limit a range of the symbols $y_k$ in time interval k of a channel output sequence y(D) where y(D)=x(D)h(D), and
2) the selection of $c_k$ is unrestrained with respect to a range of the symbols $y_k$.

37. The method of claim 35 wherein, the sequence c(D) is selected such that for each time interval k, an energy $|d_k51^2$ of dither symbols $d_k$ of a dither sequence d(D) is minimized, where, for $d_k=c_k-p_k$ where $c_k$ is a symbol from the sequence c(D) in time interval k and $p_k$ is a symbol from the sequence p(D) in the time interval k.

38. The method of claim 35 wherein, the selection of $c_k$ further includes constraints to limit a range of the symbols $y_k$ in time interval k of a channel output sequence y(D) where y(D)=x(D)h(D).

39. A digital signal processor for use in a digital communication system to precode a digital data sequence uniquely represented by an input sequence of a stream of signal points u(D) chosen from some translate of a trellis code C for transmission over a discrete-time channel with a impulse response h(D), the processor comprising:
a program storage medium having a computer program to be executed by the digital signal processor, the program comprising:
a precoding means, for selecting said signal point sequence x(D) from a subset of all possible signal point sequences that are of a form u(D)+d(D), wherein said u(D) is selected to uniquely represent said digital data sequence and wherein d(D) represents a nonzero difference between a selected nonzero code sequence c(D) from said trellis code C and a post-cursor intersymbol interference (ISI) sequence p(D) substantially of a form p(D)=x(D)[h(D)−1], such that c(D)is based upon p(D), wherein the precoding means comprises:
mapping means for mapping the digital data sequence into said signal point sequence u(D) selected from a translate of said trellis code C, and
means for generating said x(D), operably coupled to the mapping means, for altering signal point sequence u(D) to provide said x(D).

40. The digital signal processor of claim 39 wherein the precoding unit comprises at least:
mapping means, for mapping the digital data sequence into a signal point sequence u(D) selected from said translate of a trellis code C,
first combining means, operably coupled to the mapping means, to a slicing means, and, where selected, to a filtering means, for combining u(D) and at least the code sequence c(D) to provide a combiner output sequence s(D),
wherein the slicing means is operably coupled to a filtering means, and is utilized for slicing the post-cursor sequence p(D) to a selected code sequence of signal points c(D) selected from the trellis code C, and
wherein said filtering means is operably coupled to the first combining means, and is utilized for extracting the post-cursor ISI sequence p(D).

41. The digital signal processor of claim 39 wherein at least one of:
A) said trellis code C may be represented by a trellis diagram having only one state,
B) said trellis code C is a block code,
C) said u(D) is an arbitrary complex sequence from a translate of said trellis code C having n dimensions based on a partition $\Lambda/\Lambda'$ where n is a selected integer, and the slicing means provides a sequence of symbols from the sublattice $\Lambda'$ as the selected sequence c(D) on a symbol-by-symbol basis,
D) said trellis code C is based on a two-dimensional lattice partition $\Lambda/\Lambda'$, and the sequence c(D) is selected from said trellis code C with a zero delay and is dependent from symbol to symbol, and one of:
1) selection of the sequence c(D) is forced to a known state of the trellis code C at every Lth symbol, where L is a preselected integer, and
2) selection of the sequence c(D) is unforced with respect to every Lth symbol,
E) said trellis code C is a four-dimensional trellis code based on a partition $Z^4/RD_4$, wherein the sublattice is $RD_4$, and the slicing means provides the selected sequence c(D) from $RD_4$ by selecting a symbol $c_k$ from $RZ^2$ in a first symbol interval, a second symbol $c_{k+1}$ from either $2Z^2$ or its coset $2Z^2+(1,0)$, based on $c_k$, where k is an even integer, and
F) the sequence c(D) is selected such that for each time interval k, an energy $|d_k|^2$ of dither symbols $d_k$ of a dither sequence d(D) is minimized, where, for $d_k=c_k-p_k$ where $c_k$ is a symbol from the sequence c(D) in time interval k and $p_k$ is a symbol from the sequence p(D) in the time interval k and one of:
1) the selection of $c_k$ further includes constraints to limit a range of the symbols $y_k$ in time interval k of a channel output sequence y(D) where y(D)=x(D)h(D), and
2) the selection of $c_k$ is unrestrained with respect to a range of the symbols $y_k$.

42. The digital signal processor of claim 39 wherein the sequence c(D) is selected such that for each time interval k, an energy $|d_k|^2$ of dither symbols $d_k$ of a dither sequence d(D) is minimized, where, for $d_k=c_k-p_k$ where $c_k$ is a symbol from the sequence c(D) in time interval k and $p_k$ is a symbol from the sequence p(D) in the time interval k.

43. The digital signal processor of claim 39 wherein the selection of $c_k$ further includes constraints to limit a range of the symbols $y_k$ in time interval k of a channel output sequence y(D) where y(D)=x(D)h(D).

44. A digital communication system for at least mapping a digital data sequence into a signal point sequence x(D) for transmission over a channel characterized by a nonideal response h(D) using a trellis code C, comprising at least one of:

a transmission unit having:

A) a precoding unit for selecting said signal point sequence x(D) from a subset of all possible signal point sequences that are of a form u(D)+d(D), wherein u(D) is a signal point sequence from a translate of said trellis code C and uniquely represents said digital data sequence and wherein d(D) represents a nonzero difference between a selected nonzero code sequence c(D) from said trellis code C and a post-cursor intersymbol interference (ISI) sequence p(D) substantially of a form p(D)=x(D)[h(D)−1], such that c(D) is selected based only upon p(D), wherein the precoding unit comprises:

mapping means, operably coupled to a means for generating said x(D) from said signal point sequence u(D), for mapping the digital data sequence into a signal point sequence u(D) selected from said translate of a trellis code C, and means for generating and transmitting x(D), operably coupled to the mapping means, for altering signal point sequence u(D to provide x(D), B) channel means, operably coupled to the precoding means, for facilitating transmission of the transmission sequence x(D), and a receiving unit having:

C) decoding means, operably coupled to the channel means, for receiving and decoding a received transmission sequence r(D) to provide an estimated output sequence $\hat{y}(D)$; and D) recovery means, operably coupled to the decoding means, for substantially recovering an estimated sequence $\hat{u}(D)$ for said sequence u(D) for a transmitted signal point sequence x(D), selected from a subset of all possible signal point sequences that are of a form u(D)+d(D), wherein u(D) is a signal point sequence from a translate of said trellis code C and uniquely represents said digital data sequence and wherein d(D) represents a nonzero difference between a selected nonzero code sequence c(D) from said trellis code C and a post-cursor intersymbol interference (ISI) sequence p(D) substantially of a form p(D)=x(D)[h(D)−1], such that c(D) is selected based only upon p(D), wherein the precoding unit further comprises:

first combining means, operably coupled to the mapping means, and to a slicing means, for combining u(D) and at least the code sequence c(D) to provide a combiner output sequence s(D), wherein the slicing means is operably coupled to the filtering means, and is utilized for slicing the post-cursor sequence p(D) to a selected code sequence of signal points c(D) selected from the trellis code C, and a filtering means is operably coupled to the first combining means, and is utilized for extracting the post-cursor ISI sequence p(D), wherein u(D) is an arbitrary complex sequence from a translate of an n-dimensional trellis code C based on a partition Λ/Λ' (i.e., a partition of a lattice Λ into its sublattice Λ') where n is a selected integer, and the slicing means provides a sequence of symbols from the sublattice Λ' as the selected sequence c(D) on a symbol-by-symbol basis, and where interleaving is preselected, the precoding unit further includes an interleaving means for providing an interleaved coded sequence, x'(D), to the channel means, and said system further including:

first deinterleaving means, operably coupled to receive r(D), for providing a deinterleaved r(D) sequence to the decoding means, an interleaving means, operably coupled to the decoding means, for providing an interleaved estimate of the decoded sequence, $\hat{y}'(D)$, to the recovery means, and wherein the recovery means further includes second deinterleaving means for deinterleaving the interleaved estimate of the decoded sequence, $\hat{y}'(D)$.

* * * * *